United States Patent
Wang

(10) Patent No.: US 8,361,338 B2
(45) Date of Patent: Jan. 29, 2013

(54) HARD MASK REMOVAL METHOD

(75) Inventor: Shiang-Bau Wang, Pingzchen (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 360 days.

(21) Appl. No.: 12/704,032

(22) Filed: Feb. 11, 2010

(65) Prior Publication Data

US 2011/0195575 A1 Aug. 11, 2011

(51) Int. Cl.
*C23F 1/00* (2006.01)
*B44C 1/22* (2006.01)

(52) U.S. Cl. ........... 216/57; 216/58; 216/67; 216/83; 216/88; 438/706; 438/710; 438/745

(58) Field of Classification Search .......... 216/57, 216/58, 67, 83, 88; 438/706, 710, 745, 692
See application file for complete search history.

(56) References Cited

U.S. PATENT DOCUMENTS

| | | | |
|---|---|---|---|
| 6,548,892 B1 * | 4/2003 | Steiner et al. | 257/701 |
| 2007/0054500 A1 * | 3/2007 | Bencher | 438/780 |
| 2007/0184668 A1 * | 8/2007 | Ning et al. | 438/752 |
| 2007/0281495 A1 * | 12/2007 | Mallick et al. | 438/778 |
| 2008/0093629 A1 * | 4/2008 | Chen et al. | 257/190 |
| 2009/0243031 A1 * | 10/2009 | Natzle et al. | 257/508 |
| 2009/0258482 A1 * | 10/2009 | Lin et al. | 438/585 |
| 2009/0286373 A1 * | 11/2009 | Tan et al. | 438/301 |

* cited by examiner

*Primary Examiner* — Shamim Ahmed
(74) *Attorney, Agent, or Firm* — Lowe Hauptman Ham & Berner, LLP

(57) ABSTRACT

The embodiments of methods described in this disclosure for removing a hard mask layer(s) over a polysilicon layer of a gate stack after the gate stack is etched allows the complete removal of the hard mask layer without the assistance of photolithography. A dielectric material is deposited over the substrate with the gate stacks. The topography of the substrate is removed by chemical mechanical polishing first. Afterwards, an etching gas (or vapor) is used to etch a portion of the remaining dielectric layer and the hard mask layer. The etching gas forms an etch byproduct that deposits on the substrate surface and can be subsequently removed by heating. The etching and heating to remove etch byproduct are repeated until the hard mask layer is completed removed. Afterwards, the remaining dielectric layer is removed by wet etch. The methods described are simpler and cheaper to use than conventional methods for hard mask removal.

20 Claims, 15 Drawing Sheets

HARD MASK REMOVAL METHOD

FIELD

This application relates to hard mask removal and, more particularly, to removal of hard mask deposited over polysilicon of gate structures.

BACKGROUND

The semiconductor integrated circuit (IC) industry has experienced rapid growth. Technological advances in IC manufacturing and design have produced generations of ICs where each generation has smaller and more complex circuits than the previous generation. Such advances have increased the complexity and challenges of manufacturing of ICs. In IC manufacturing (or processing), hard mask is used to protect against loss of un-intended material(s) on the substrate during etching process. To pattern gate structures with polysilicon, a hard mask is deposited over polysilicon to prevent its loss during etching. Such hard mask needs to be removed after processing operations, such as patterning etch, implantation, wet cleaning, etc., to allow polysilicon to become either polycide (for polysilicon gate) or be replaced by another conductive metal (for replacement gate).

Removing hard mask over polysilicon has become increasingly challenging. It is within this context the following disclosure arises.

SUMMARY

The embodiments of methods described below for removing a hard mask layer(s) over a polysilicon layer of a gate stack after the gate stack is etched allows the complete removal of the hard mask layer without the assistance of photolithography. A dielectric material is deposited over the substrate with the gate stacks. The topography of the substrate is removed by chemical mechanical polishing first. Afterwards, an etching gas (or vapor) is used to etch a portion of the remaining dielectric layer and the hard mask layer. The etching gas forms an etch byproduct that deposits on the substrate surface and can be subsequently removed by heating. The etching and heating to remove etch byproduct are repeated until the hard mask layer is completed removed. Afterwards, the remaining dielectric layer is removed by wet etch. The methods described are simpler and cheaper to use than conventional methods for hard mask removal.

In one embodiment, a method of removing a hard mask used for patterning gate stacks is provided. The method includes an operation of patterning gate stacks on a substrate. The gate stacks include a polysilicon layer and the hard mask is deposited over the polysilicon layer to assist its patterning. The method also includes an operation of depositing a dielectric layer on the substrate after the gate stacks are patterned. The method further includes an operation of planarizing a first portion of the dielectric layer by chemical mechanical polish (CMP) to remove topography on the substrate. In addition, the method includes an operation of removing a second portion of the dielectric layer and the hard mask by using an etching gas, and an operation of etching the remaining dielectric layer by using a wet etching chemistry.

In another embodiment, a method of removing a hard mask used for patterning gate stacks is provided. The method includes an operation of patterning gate stacks on a substrate. The gate stacks include a polysilicon layer and the hard mask is deposited over the polysilicon layer to assist its patterning. The method also includes an operation of depositing a dielectric layer on the substrate after the gate stacks are patterned, and an operation of planarizing a first portion of the dielectric layer by chemical mechanical polish (CMP) to remove topography on the substrate. A first etching ratio of the dielectric layer to the hard mask by the etching gas is between about 0.5 to about 2. The method further includes an operation of removing a second portion of the dielectric layer and the hard mask by using an etching gas, and an operation of etching the remaining dielectric layer by using a wet etching chemistry. A second etching ratio of the dielectric layer to other films on the substrate by the wet etching chemistry is greater than about 4.

In yet another embodiment, a method of removing a dual-layer hard mask used for patterning gate stacks is provided. The method includes an operation of patterning gate stacks on a substrate. The gate stacks include a polysilicon layer and the dual-layer hard mask is deposited over the polysilicon layer to assist its patterning. The dual-layer hard mask includes an oxide layer over a nitride layer. The method also includes depositing a dielectric layer on the substrate after the gate stacks are patterned. The method further includes an operation of planarizing a first portion of the dielectric layer by chemical mechanical polish (CMP) to remove topography on the substrate. A first etching ratio of the dielectric layer to the dual-layer hard mask by the etching gas is between about 0.5 to about 2. In addition, the method includes an operation of removing a second portion of the dielectric layer and the dual-layer hard mask by a first etching gas and a second etching gas. The first etching gas removes the second portion of the dielectric layer and the oxide layer of the dual-layer hard mask, and the second etching gas removes the nitride layer of the dual-layer hard mask. Additionally, the method includes an operation of etching the remaining dielectric layer by using a wet etching chemistry. A second etching ratio of the dielectric layer to other films on the substrate by the wet etching chemistry is greater than about 4.

Other aspects and advantages of the invention will become apparent from the following detailed description, taken in conjunction with the accompanying drawings, illustrating by way of example the principles of the invention.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1A:
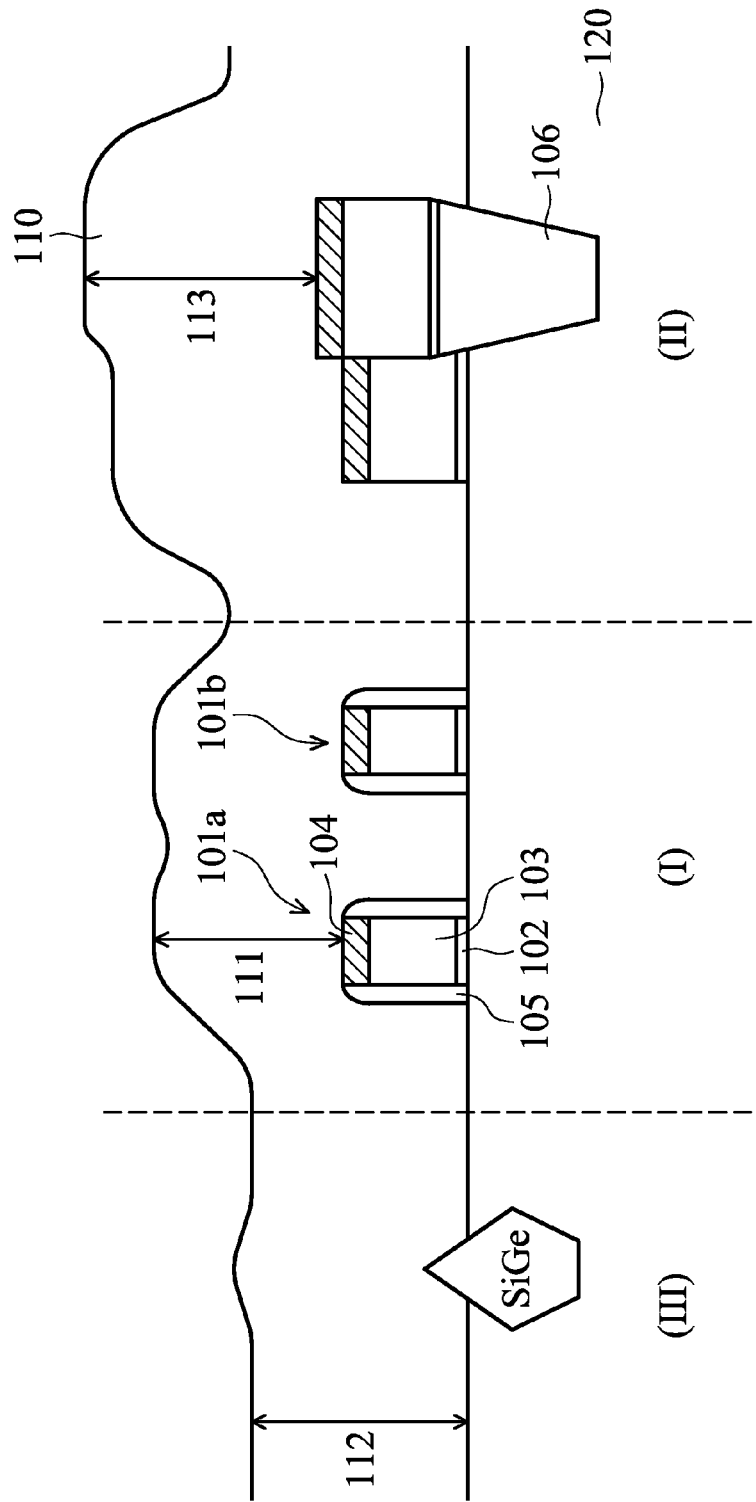
FIG. 1A shows a diagram of three regions on a substrate, in accordance with one embodiment of this disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1A shows a diagram of three regions on a substrate, in accordance with one embodiment of this disclosure. Region I shows two gate structures 101a and 101b, which include a gate dielectric layer 102, which can be a silicon oxide layer, an oxy-nitride composite layer, a high-dielectric constant (high-K) dielectric layer, or an high-K dielectric layer over an oxide layer. The gate structures 101a, 101b are built on a substrate 120. The gate structures 101a, 101b also include a polysilicon layer 103, which can be used as a gate layer (conventional polysilicon over dielectric gate stack) or a dummy layer (replacement gate), which would be replaced with a metal at a later processing operation. The material of the metal for replacement gate may be Al, Al alloy, Ti, TiN, Ta, TaN, or other suitable metal. The gate structures 101a, 101b may also include other layers, such as a barrier layer and/or a workfunction layer for replacement gates (not shown). On top of the polysilicon layer 103, there is a hard mask layer 104, which is used with photoresist to pattern gate the structures 101a and 101b. Gate structures 101a, 101b are surrounded by nitride spacers 105. The hard mask layer 104 can be made of oxide, nitride, or a combination of oxide and nitride (dual-layer hard mask).

Region II contains non-gate structures that are larger in dimension. The layers in gate structures 101a, 101b, such as layer 102, 103, 104, and 105 of region I also exist in Region II. Due to larger dimension of the patterns, the thickness of the hard mask layer 104 can sometimes be higher. For example, if the thickness of the hard mask layer 104 is 150 Å (angstroms) in region I, the thickness of the hard mask layer 104 is 180 Å in region II in one instance. Further, the height of the hard mask layer can be raised by the height of the trench isolation 106, as shown in FIG. 1A. In contrast, there are no gate structures or layers of gate structures in region III. The uneven height of structures and variation of hard mask layer thickness in different areas (or regions) on the substrate make the removal of the hard mask layer 104 challenging.

In one embodiment, the hard mask layer 104 is removed by first depositing a photoresist layer 110, which is used to protect the substrate surface from being damaged during hard mask layer removal. Due to the flowing nature of photoresist, the thickness 111 of the photoresist layer 110 on top of the gate structures 101a, 101b is thinner than the thickness 112 on non-gate region (region III). The thinner thickness 111 allows the photoresist layer in region I (gate structures) to be cleared first and the hard mask layer 104 be etched before the photoresist layer over the non-gate region III is completely removed. However, due to the larger dimension of the non-gate structures in regions II, such as input/output (I/O) device area of the chip, the photoresist thickness 113 in region III is thicker than thickness 111 in region I.

Figure 1B:
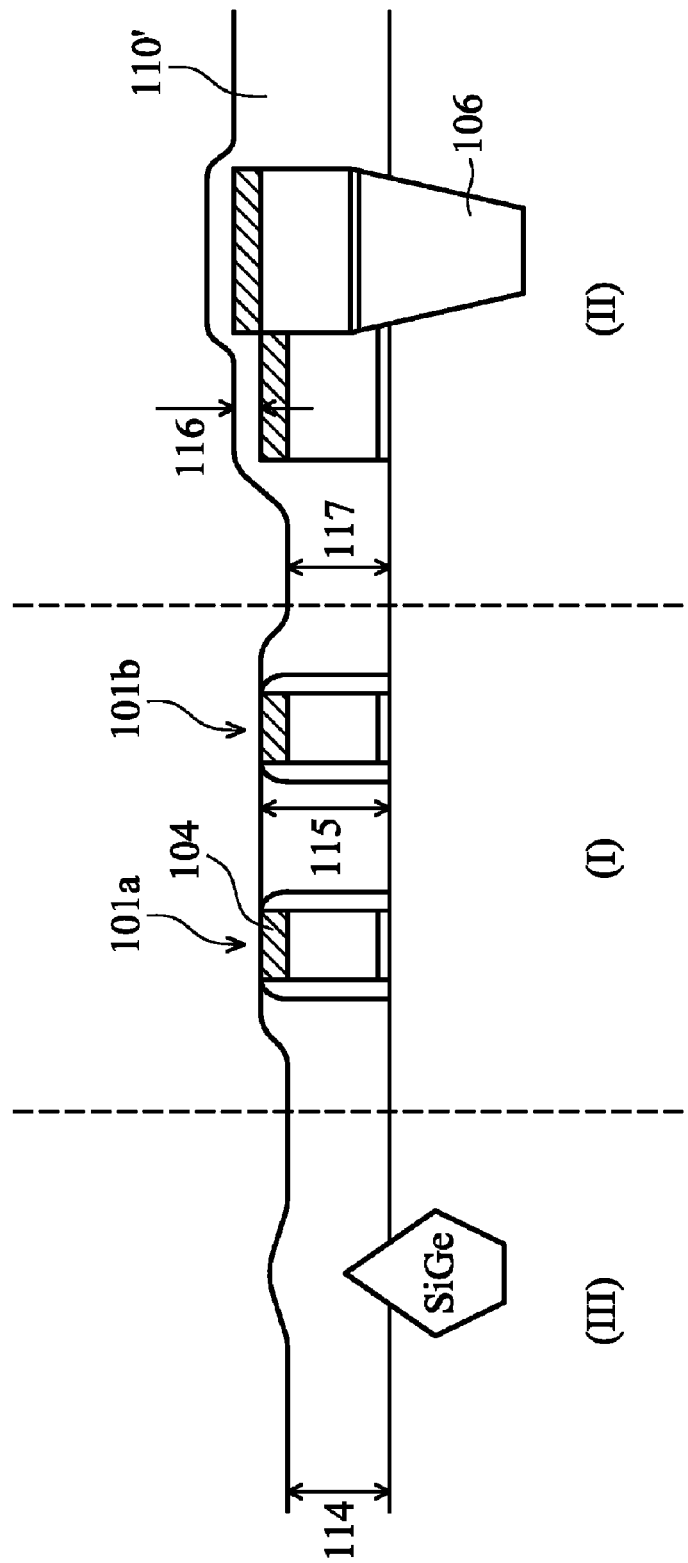
FIG. 1B shows that the photoresist layer of FIG. 1A being thinned to expose the hard mask layer, in accordance with one embodiment of this disclosure.

FIG. 1B shows that the photoresist layer 110 of FIG. 1A being thinned to layer 110' to expose the hard mask layer 104 in region I, in accordance with one embodiment of this disclosure. Some photoresist is left on the substrate, such as thickness 114 in region III, and thickness 115 in region I, and thickness 117 in region II, to protect the substrate surface and structures in regions I, II, and III from being damaged during the hard mask layer removal process. However, some photoresist remains on hard mask layer of large dimension non-gate structures in region II, for example with a thickness 116, as shown in FIG. 1B. Additional removal of photoresist would run the risk of not having sufficient photoresist protecting the substrate surface during hard mask layer removal. However, the remaining photoresist on hard mask layer of large dimension non-gate structures in region II and the thicker hard mask layer on these structures make consistent and complete removal of hard mask layer on these structures (in region II) impossible. Without the complete removal of the hard mask layer, the polysilicon cannot be properly converted into polycide (for conventional polysilicon over dielectric gate stack), or cannot be completely removed and be replaced with another gate metal (for replacement gate). Experimental data show that residual hard mask layer has been on structures with width as small as about 0.36 µm in region II.

Figure 2A:
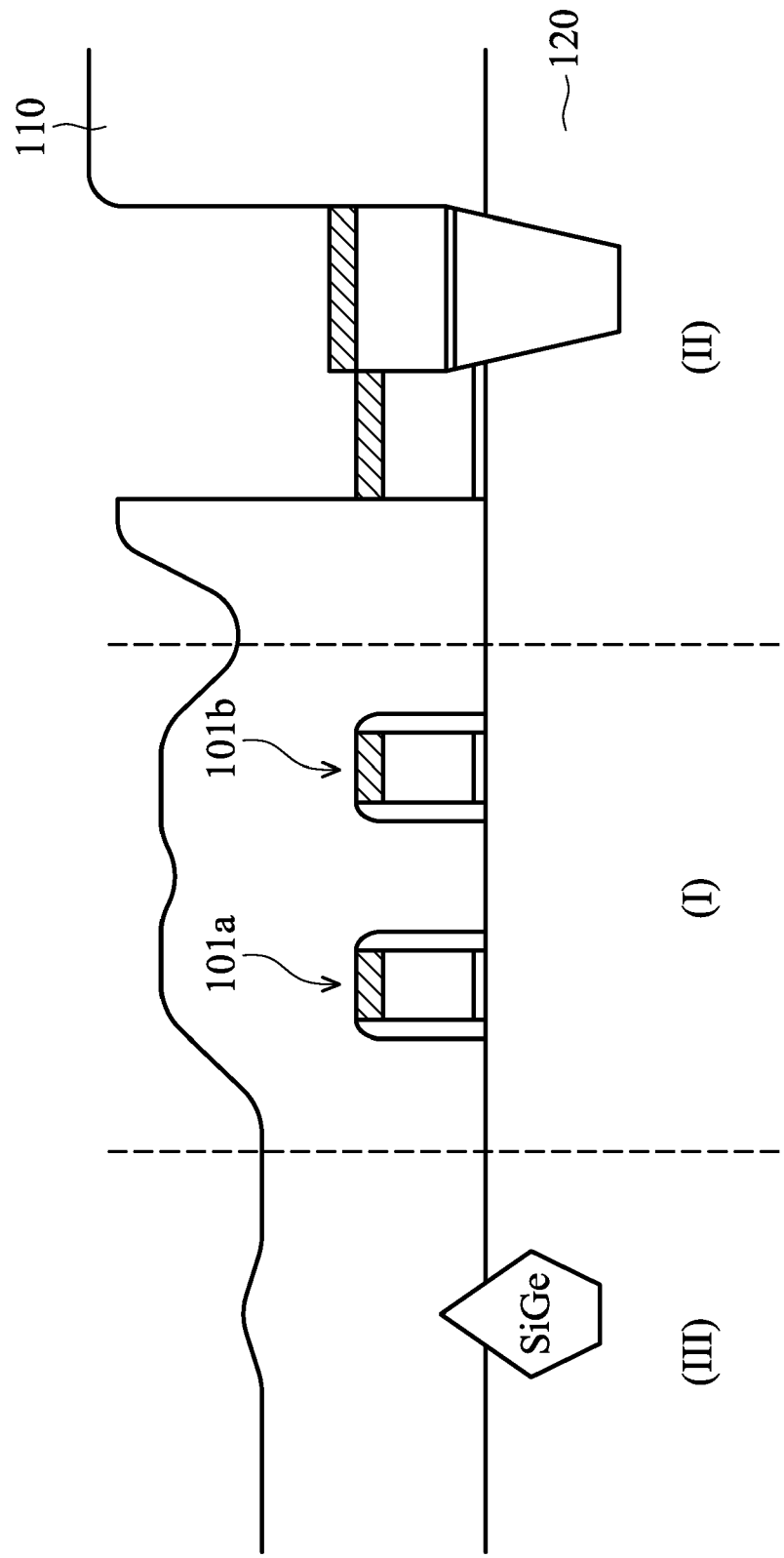
FIG. 2A shows the thickness of photoresist across the three regions after photoresist in the exposed regions, such as region II, has been removed, in accordance with one embodiment of this disclosure.

To solve the problem of residual hard mask layer on wide structures such as those described above (i.e. in region II), a lithographical exposure by using an extra photo mask to remove photoresist on wider structure is used. FIG. 2A shows the thickness of photoresist across the three regions after photoresist on wide structures (such as structures in region II) has been removed, in accordance with one embodiment of this disclosure. A photoresist removal process can be used to expose the hard mask layer 104 as shown in FIG. 1B, with the difference that there will not be remaining photoresist on structures in region II (thickness 116 is zero as shown in FIG. 2A). Afterwards, the hard mask layer 104 in region I and the thicker hard mask layer 104 in region II can be completely removed by the etching process without damaging the substrate surface and the structures (such as the SiGe structure) in region I.

Figure 2B:
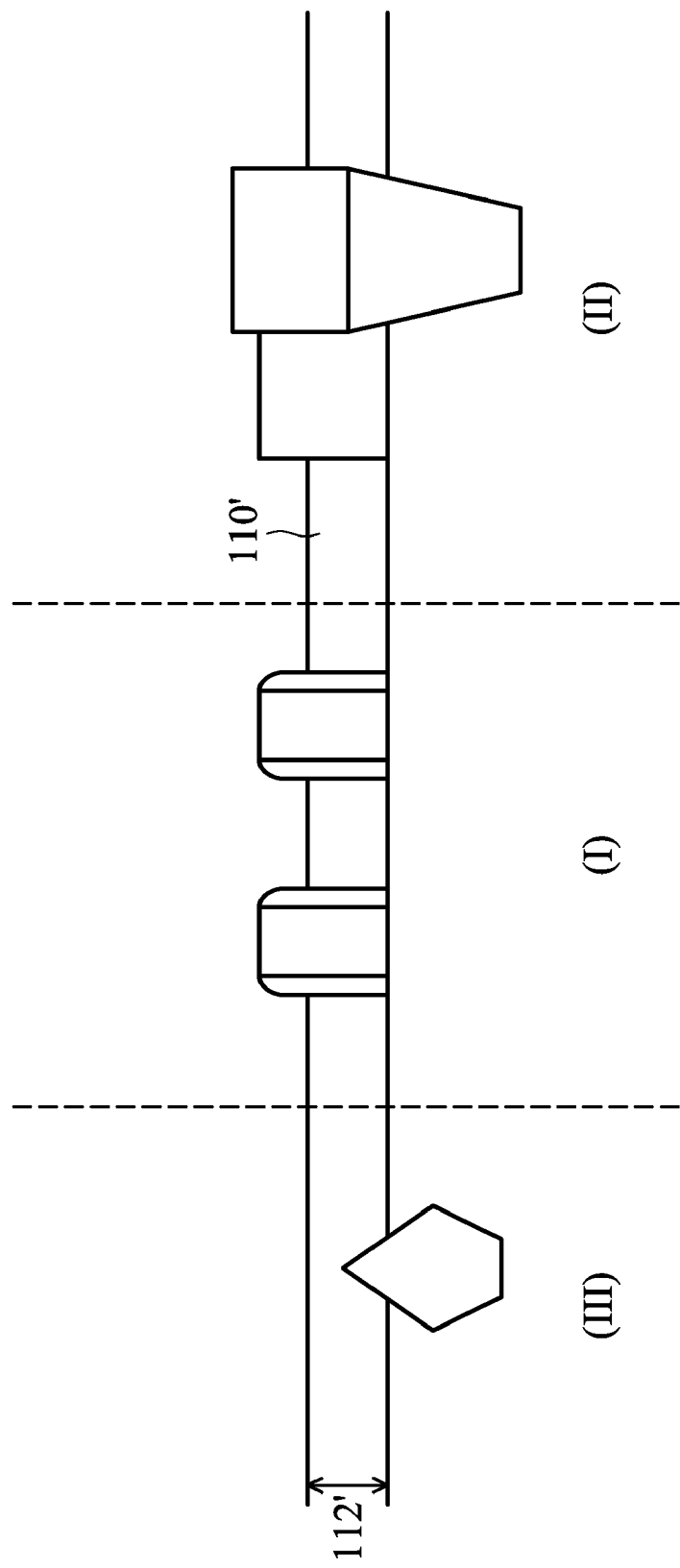
FIG. 2B shows the structures and layer of FIG. 2A after a hard mask layer is removed, in accordance with one embodiment of this disclosure.

In one embodiment, the etching chemistry is a plasmarized $C_XF_Y$ gas diluted with He (helium), which etches dielectric films, such as $SiO_2$, $Si_3N_4$, and SiON. Photoresist can also be etched by this chemistry, but at a lower rate. FIG. 2B shows the structures and layer of FIG. 2A after the hard mask layer 104 is removed, in accordance with one embodiment of this disclosure. In FIG. 2B, there is still a thickness 112' of the residual photoresist layer 110" covering the substrate surface and the SiGe structure in region III.

Figure 2C:
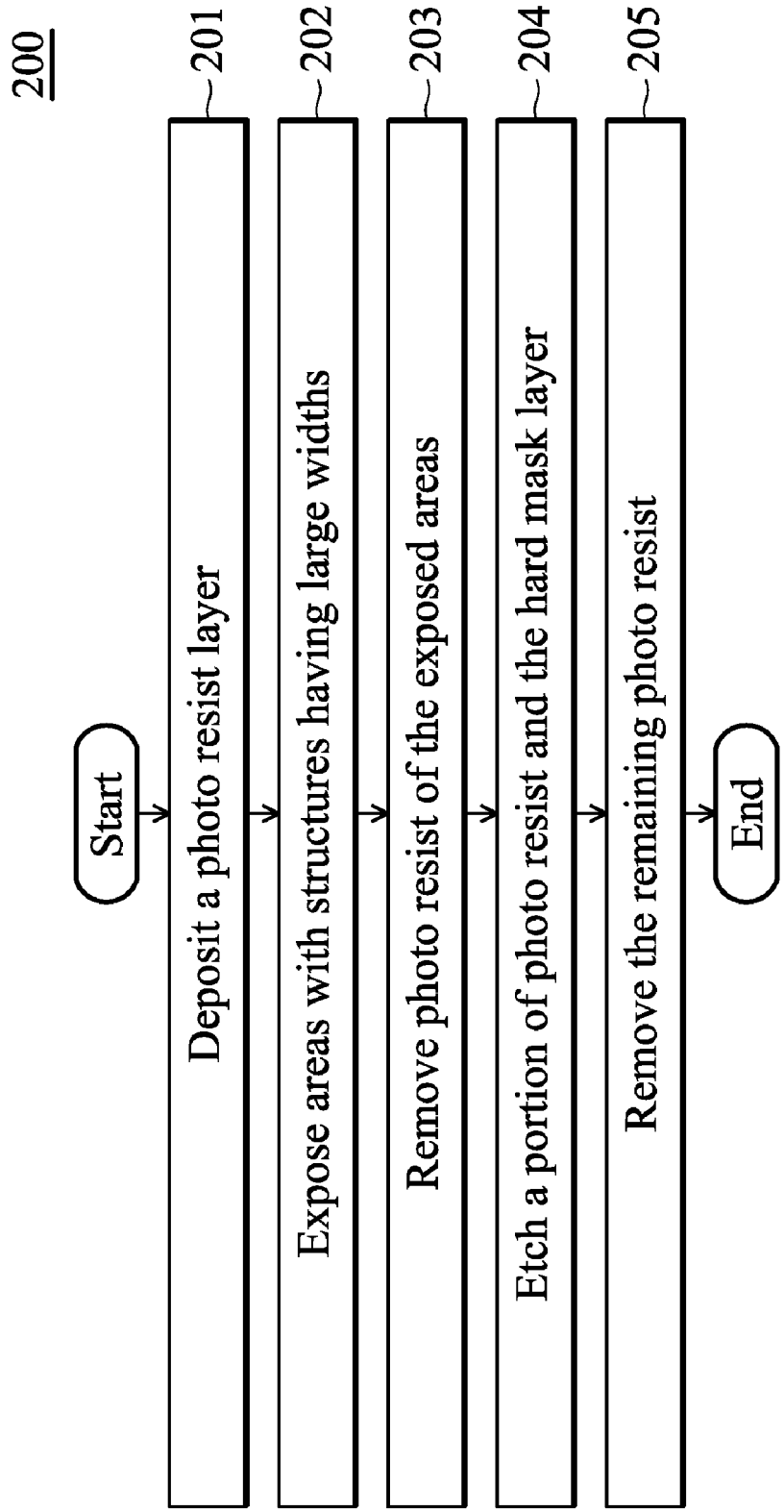
FIG. 2C shows a process flow used to remove hard mask layer, in accordance with one embodiment of this disclosure.

FIG. 2C shows a process flow 200 for removing a hard mask layer as described above along with FIGS. 2A and 2B, in accordance with one embodiment of this disclosure. Process flow 200 starts with operation 201, in which a photoresist layer is deposited. At the next operation 202, a photomask is used to expose areas with structures having large width(s) of a hard mask layer covering a polysilicon layer to enable the photoresist in the exposed areas to be removed at next operation. In one embodiment, structures with the hard mask layer that have\ width(s) great than or equal to 0.3 µm are exposed. At operation 203, the photoresist in the exposed region is removed. The exposed photoresist is removed by a photoresist etch back process, which uses a solution to selectively remove the exposed photoresist. Afterwards at operation 204, a dry etch is applied to etch a portion of the photoresist and the hard mask layer. At operation 205, the remaining photoresist is removed, for example by photoresist ashing followed by a final wet clean.

Figure 2D:
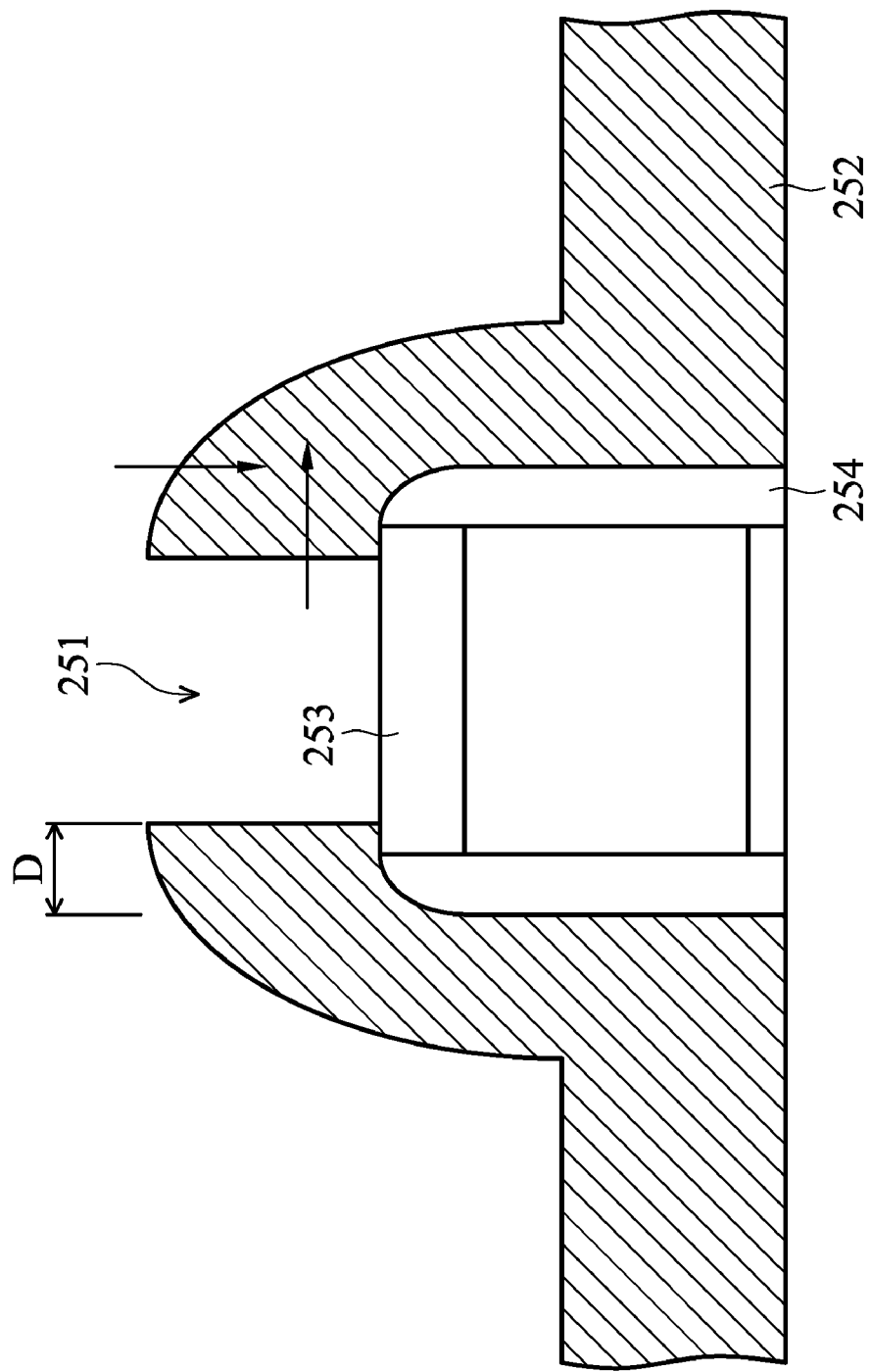
FIG. 2D is a gate structure with most of the photoresist on top of the gate structure exposed, in accordance with one embodiment of this disclosure.
Figure 2E:
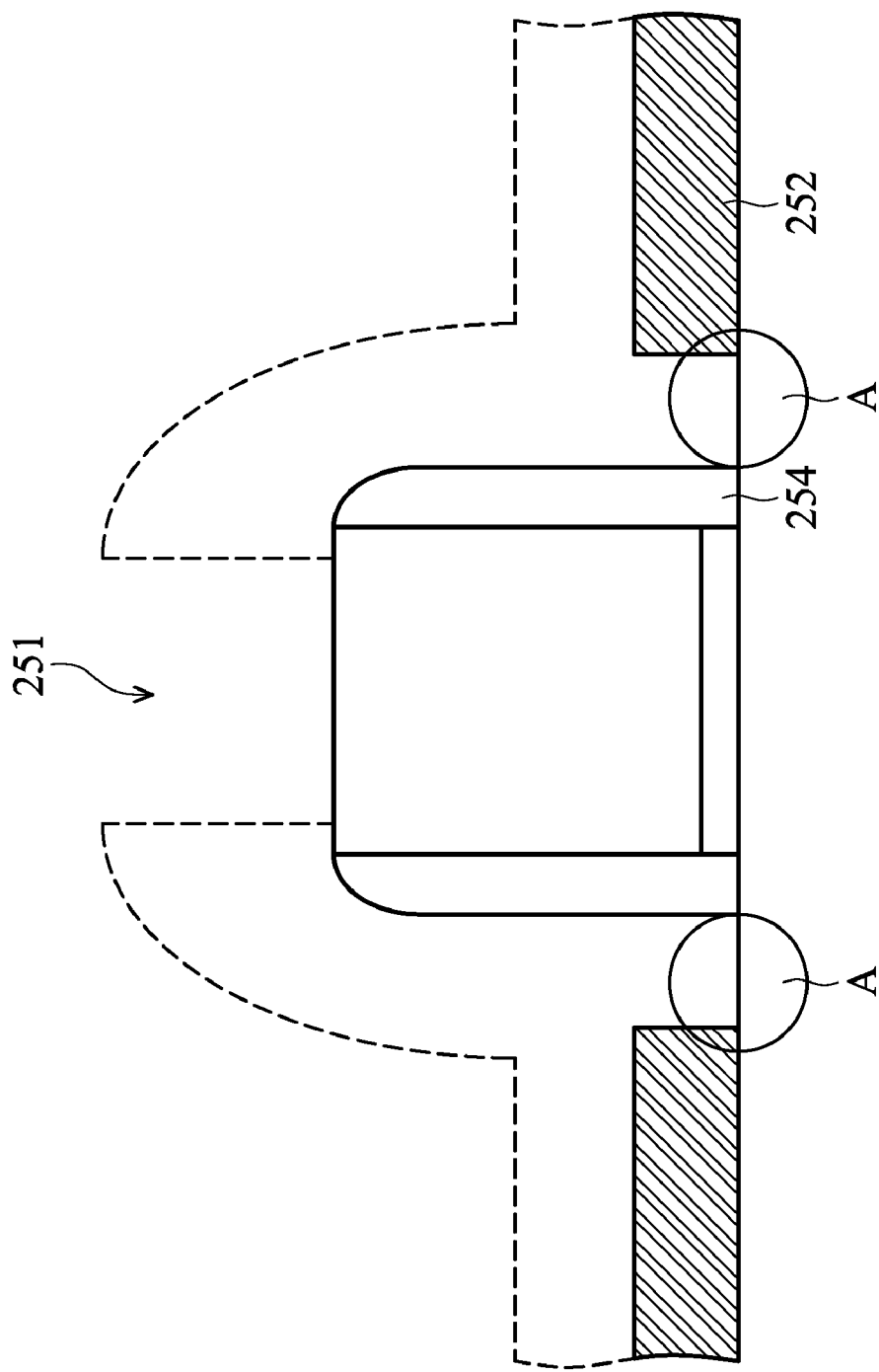
FIG. 2E shows the structure of FIG. 2D after the hard mask is removed, in accordance with one embodiment of this disclosure.

The process described above in FIGS. 2A-2C can remove hard mask layer from substrate surface. However, adding an extra operation of photomask exposure can be quite costly. In semiconductor manufacturing, the photolithography process is an expensive operation due to the high cost of processing equipment, an additional mask design, and mask preparation. During the mask design, overlay design needs to be taken into consideration. FIG. 2D shows a gate structure 251 with a patterned photoresist layer 252, in accordance with one embodiment of this disclosure. The gate structure 251 has a hard mask layer 253 on top. A small amount of photoresist with width D (overlay) needs to remain over the edge of gate structure 251, because during the etching hard-mask removal process there is a lateral (or horizontal) etching component in addition to the vertical etching component. Without sufficient safe distance "D", the photoresist would be etched to expose areas "A" next to the nitride spacer 254, as shown in FIG. 2E. The areas "A" has silicon on the surface, which can be damaged when exposed to etching plasma. Due to such concern, overlay design is very important and challenging. If the overlay amount is too little, there is a risk of exposing area "A". However, if the overlay amount is too large, the hard mask layer 253 might not be removed completely. In addition to the design of overlay, alignment is also very important during photolithography to ensure sufficient coverage of both sides of the gate structure 251. The overlay design and alignment add to the complexity of the additional photolithography process.

Figure 3A:
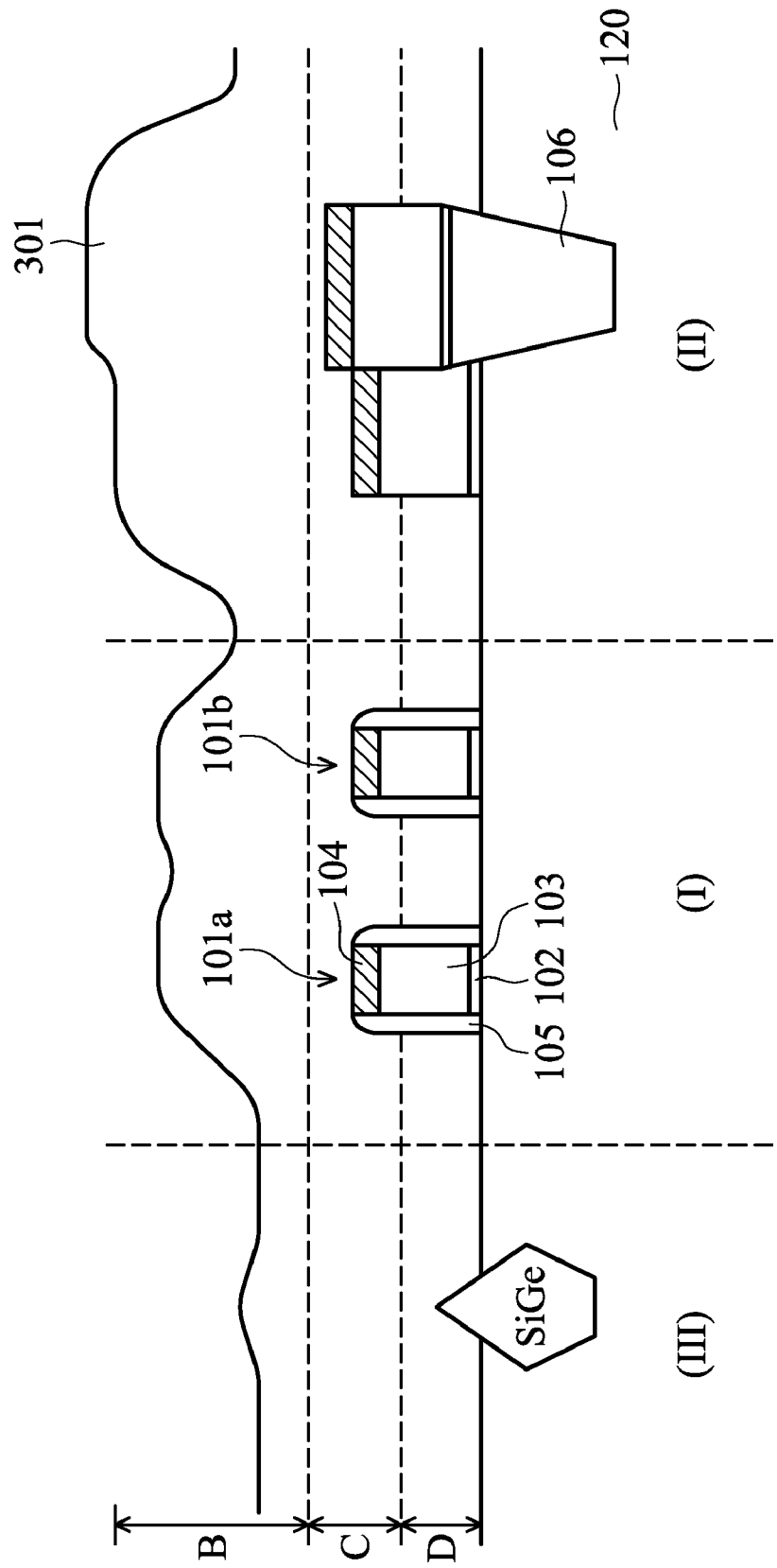
FIG. 3A shows a cross section of device regions shown above in FIGS. 1A, 1B, 2A, and 2B after dielectric layer is deposited on the substrate, in accordance with one embodiment of this disclosure.

Based on the concerns for cost involved with designing and making an extra mask and lithographical process, another process for removing the hard mask layer is proposed. FIG. 3A shows a cross section of device regions shown above in FIGS. 1A, 1B, 2A, and 2B after a dielectric layer 301 is deposited on the substrate, in accordance with one embodiment of this disclosure. The dielectric layer 301 can be an oxide, a nitride, or an oxynitride (SiON) film. Part of the dielectric layer 301 (layer B), is then planarized by chemical mechanical polishing (CM)) to remove the topography of the substrate. CMP is used because of it global planarization capability. The dielectric layer 301 should be hard enough to withstand the pressure and stress applied by the CMP process. In one embodiment, the dielectric layer 301 is a spin-on-dielectric and is densified before CMP to increase the density and hardness of the film. After CMP planarization, the dielectric layer 301 in layer "C" hard mask layer 104 are removed by an etching process, which can etch the material of the dielectric layer 301 and the hard mask layer 104. The remaining dielectric layer 301 in layer "D" is finally etched away by a chemistry that etches the material dielectric layer 301 at a high selectivity compared to other materials exposed to the etching chemistry.

The CMP planarization allows the topography of the substrate surface to be removed. No photoresist or additional lithographical process (or photomask) is needed. Since no additional lithographical process is needed, neither overlay nor alignment is an issue. The simplified process flow requires an etching chemistry/process that can etch the dielectric layer 301 and the hard mask layer 104 at roughly the same rates to allow the complete removal of the hard mask layer 104 before the complete removal of the dielectric layer 301. In one embodiment, the etch selectivity of the hard mask layer 104 to the dielectric layer 301 is between about 0.5 to about 2. Etch selectivity is defined as a ratio of etch rates of two materials. Once the hard mask layer is removed, the remaining dielectric layer 301 should be etched away without etching away other materials, which may include PECVD (plasma-enhanced chemical vapor deposition) oxide and/or thermal oxide film(s), on the substrate. The etching chemistry/process should have a high selectivity of the dielectric material 301 versus other types of materials on the substrate surface to avoid damaging the substrate surface and/or structures (or films of the structures) on the substrate. In one embodiment, the etch selectivity of the dielectric film to other films on the substrate by the etching chemistry/process is between about 4 to about 20.

Figure 3B:
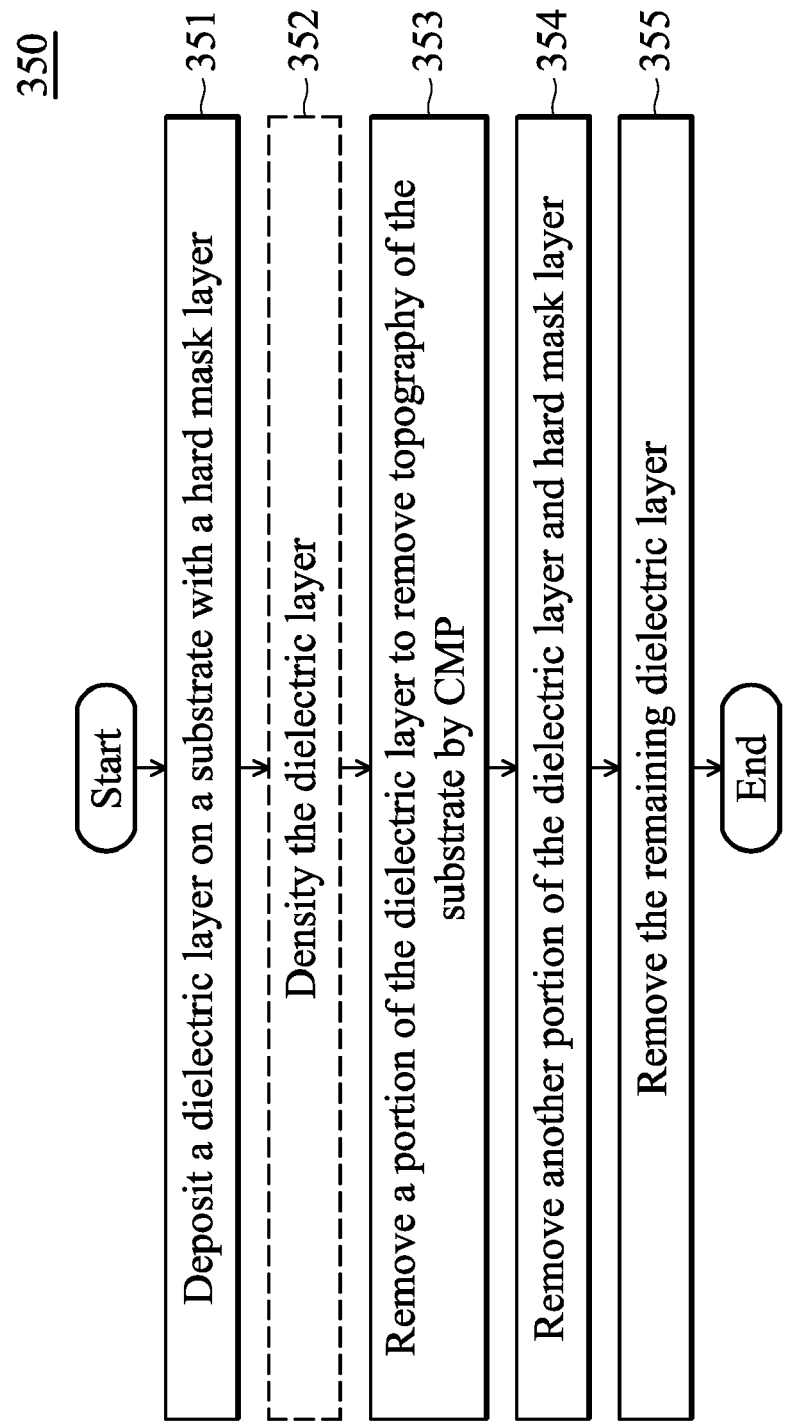
FIG. 3B shows a process flow for removing a hard mask layer, in accordance with one embodiment of this disclosure.

FIG. 3B shows a process flow 350 for removing a hard mask layer described above, in accordance with one embodiment of this disclosure. At operation 351, a dielectric layer is deposited on a substrate surface with gate stacks, which has a hard mask layer on top. At an optional operation 352, the dielectric layer deposited at operation 351 is densified. The densification process can remove the gaseous species, such as moisture, from the dielectric film and/or increase the hardness of the dielectric film. For some dielectric films, the densification process enables the dielectric films to withstand CMP. At operation 353, a portion of the dielectric layer is planarized by CMP to remove surface topography globally across the substrate. At next operation 354, an etchback process is applied on the substrate to remove another portion of the dielectric film (or layer) 301 and hard mask layer 104. The etchback process is able to remove both the dielectric film and the hard mask layer 104. Afterwards, at operation 355, the remaining dielectric layer is removed by an etching chemistry/process.

Examples of materials for the dielectric layer 301 suitable for applications described above may include, but are not limited to, spin-on dielectric (SOD) films, spin-on glass (SOG) films, TEOS (tetraethyl orthosilicate)/ozone oxide films, and flowable CVD oxide films. In one embodiment, the dielectric film is an oxide (or silicon dioxide) film. An example of SOD films is perhydro-polysilazane (PSZ), made by TEL (or Tokyo Electro Limited. An example of TEOS/ozone oxide film is HARP (high aspect ratio process) thermal CVD film by a TEOS/Ozone chemistry, offered by Applied Materials of Santa Clara, Calif. An example of a flowable CVD oxide film is Alectrona, which is a carbon free flowable CVD silicon oxide and is also offered by Applied Materials of Santa Clara, Calif.

SOD and SOG films are not very dense, in comparison to oxide films deposited by plasma-enhanced chemical vapor deposition (PECVD), thermal process (thermal oxide), or high-density plasma chemical vapor deposition (HDPCVD).

As deposited SOD films can be too soft to be planarized by CMP. A densification process could be needed to increase the hardness of the film. In one embodiment, the as-deposited dielectric film is densified (or annealed) at a temperature equal to or less than about 450° C. to prevent affecting the quality of silicide formed. When an SOD or SOG film is annealed, the surface layer is densified first (or densified more significantly), because moisture and other volatile compounds are driven to leave the film from the surface. With the progression of densification time, thicker surface film is densified (or significantly densified). The more densified (or significantly densified) surface film has lower wet etch rate than the SOD/SOG film underneath. The densified surface SOD/SOG film can withstand the pressure and stress of CMP.

In one embodiment, an annealing gas is used during the densification process. In one embodiment, the annealing gas is an inert gas. In another embodiment, the annealing gas includes $N_2$ and/or $O_2$. In one embodiment, the annealing is performed at a temperature between about 300° C. to about 450° C. The annealing (or densification) can be performed by furnace annealing, rapid thermal processing or a laser annealing. In one embodiment, the annealing is performed for a duration less than 60 minutes. In another embodiment, the annealing is performed for a duration less than 10 minutes.

After the surface topology is removed by CMP, the remaining dielectric film near the hard mask layer 104 and the hard mask layer 104 is removed. In one embodiment, the hard mask layer 104 is a PECVD oxide. As mentioned above, the etch rates of the dielectric film and the hard mask layer 104 should be relatively close. In one embodiment, an etching gas is used to etch the dielectric film and the hard mask layer 104. The etching gas can be plasmarized by a remote plasma generator. For example, the etching gas can contain NF3 and NH3, which are plasmarized by a remote plasma generator. Equation (1) shows an embodiment of the generation of etching species:

$$NF_3 + NH_3 \_ NH_4F + NH_4F \cdot HF \quad (1)$$

In one embodiment, the etching gas may contain an inert gas, such as helium (He), neon (Ne), argon (Ar), krypton (Kr), xenon (Xe). The F* radicals ($NH_4F$, $NH_4F \cdot HF$) generated from $NF_3$ and $NH_3$ can etch silicon nitride and silicon oxide films. As mentioned above, the dielectric film is a spin-on oxide film in one embodiment. The spin-on oxide film is etched at about the same rate as the hard mask layer (PECVD oxide) by the F* radicals. Equation (2) shows an embodiment of the etching reaction.

$$NH_4F + NH_4F \cdot HF + SiO_2 \rightarrow (NH_4)_2SiF_6 + H_2O \quad (2)$$
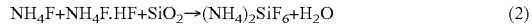

The etching residue, $(NH_4)_2SiF_6$, accumulates on the substrate surface and eventually forms a film on the substrate surface. When the film formed by the etch byproduct covers the entire substrate surface, the etchant cannot reach the substrate surface. The etch byproduct film needs to be removed. The film formed by the etch residue can be removed by heating (or an annealing process). Equation (3) shows an embodiment of the decomposition reaction caused by heating.

$$(NH_4)_2SiF_6 \rightarrow SiF_4 + NH_3 + HF \quad (3)$$

$SiF_4$, $NH_3$, and HF are all gaseous species and would evaporate from the surface of the substrate.

In another embodiment, the etching gas includes HF and $NH_3$, which are not plasmarized. The etching gas may also include an inert gas. HF and $NH_3$ are absorbed on the substrate surface to react with $SiO_2$. In one embodiment, the surface reactions are described by equations (4), (5), and (6).

$$SiO_2 + 4HF \rightarrow SiF_4 + 2H_2O \quad (4)$$

$$SiO_2 + 4HF + 4NH_3 \rightarrow SiF_4 + 2H_2O + 4NH_3 \quad (5)$$
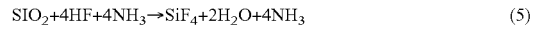

$$SiF_4 + 2HF + 2NH_3 \rightarrow (NH_4)_2SiF_6 \quad (6)$$

The etching gas that includes non-plasmarized HF and $NF_3$ also react with $SiO_2$ to form $(NH_4)_2SiF_6$ and residual gaseous species, such as $SIF_4$, $H_2O$ and $NH_3$. $(NH_4)_2SiF_6$ can be removed from the substrate surface according to equation (3) shown above.

In one embodiment, the heating is performed at a temperature between about 125° C. to about 180° C. Heating elements can be placed under the substrate holder to perform the heating. In one embodiment, the etching and heating to remove etch byproduct(s) are performed in the same chamber. In another embodiment, the etching and heating to remove etch byproduct(s) are performed in separate chambers. In one embodiment, the heating is performed for a duration less than about 5 minutes. In another embodiment, the heating is performed for a duration less than 3 minutes. The process of etching and heating could be repeated several times to complete the hard mask removal.

Figure 4A:
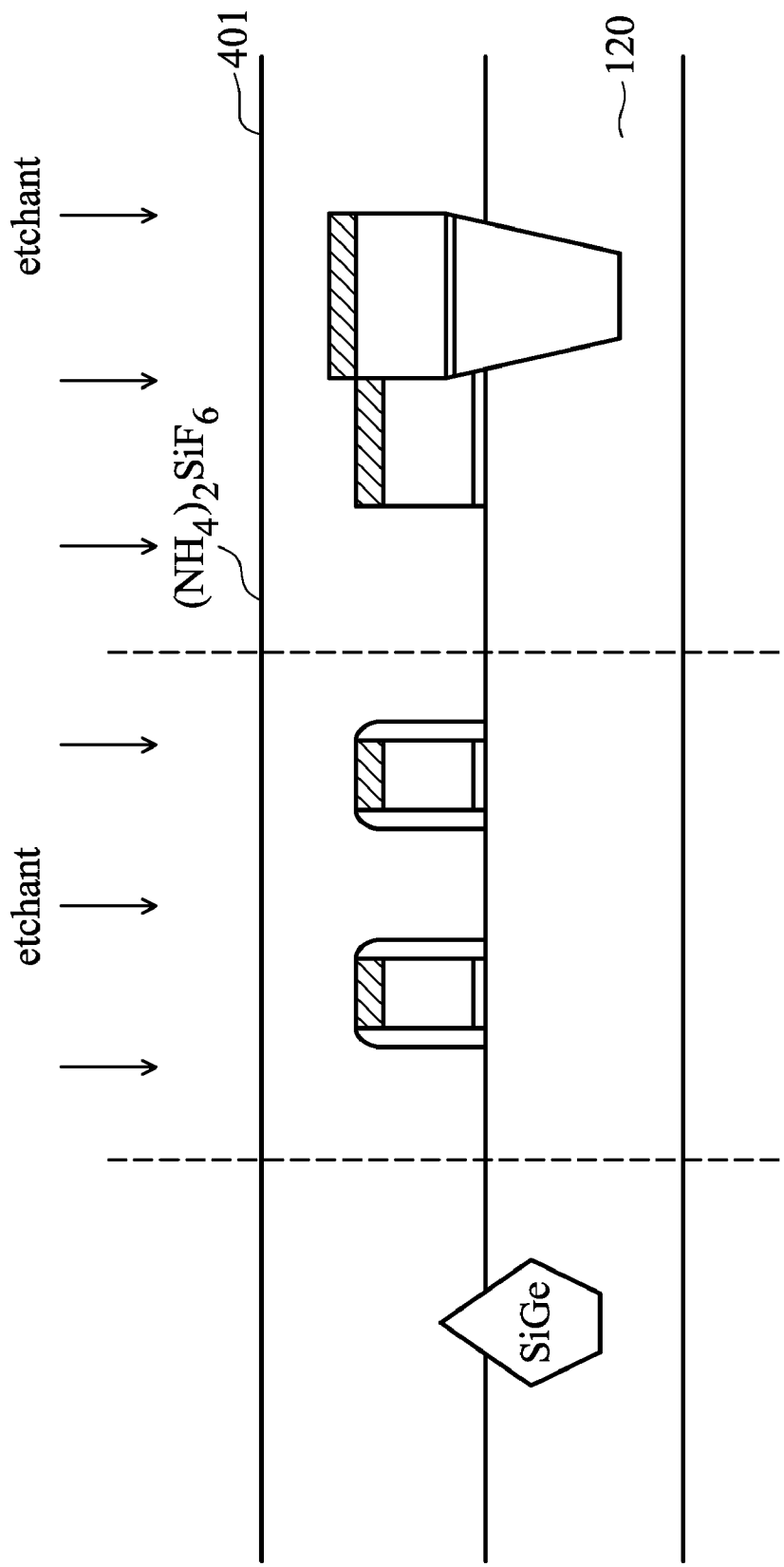
FIG. 4A shows a layer of etching byproduct being formed on the substrate surface, in accordance with one embodiment of this disclosure.
Figure 4B:
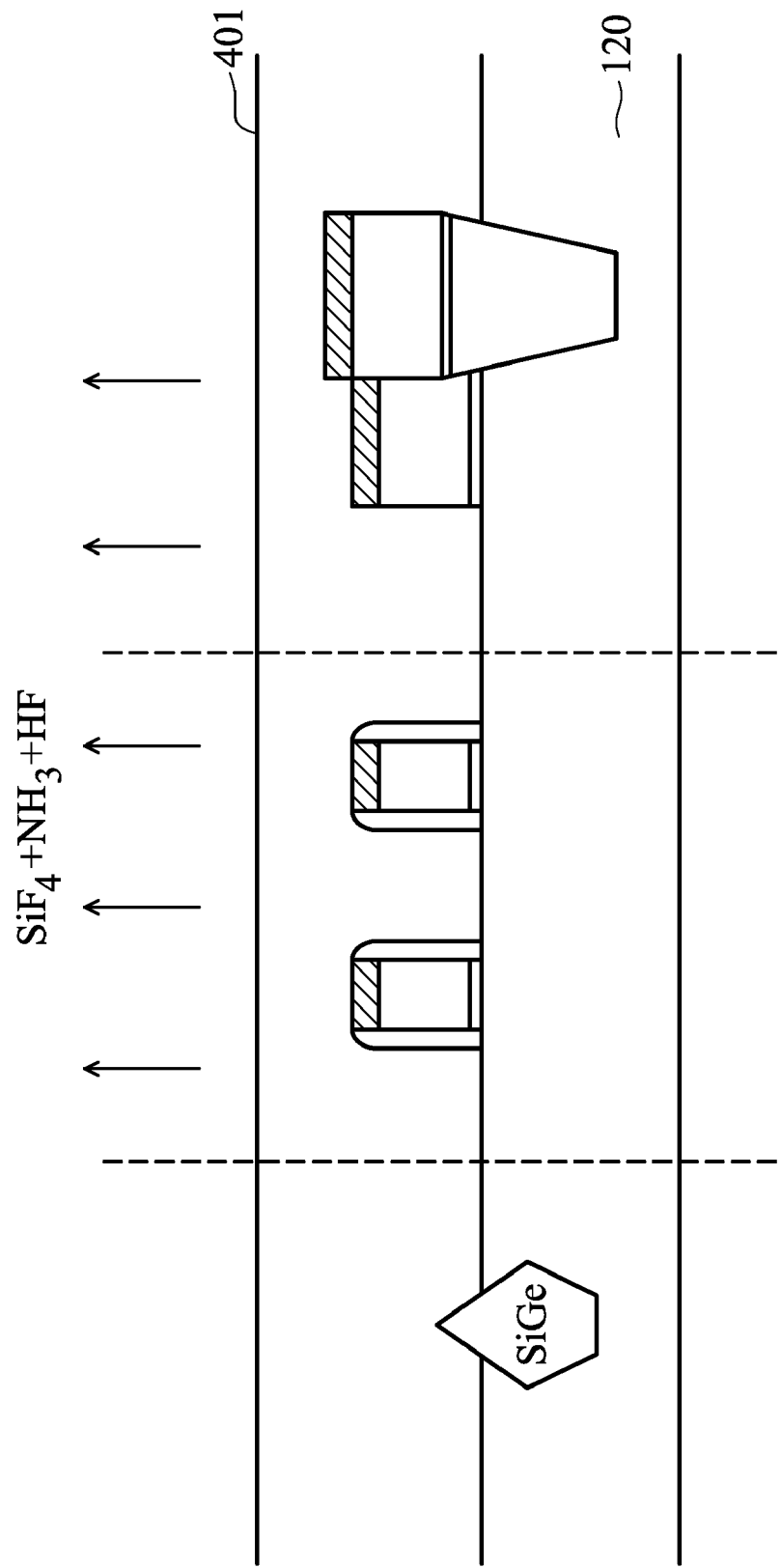
FIG. 4B shows the layer of etching byproduct being removed (or evaporated) from the substrate surface by heating, in accordance with one embodiment of this disclosure.

FIG. 4A shows a layer 401 of etching byproduct (($NH_4)_2SiF_6$) being formed on the substrate surface, in accordance with one embodiment of this disclosure. FIG. 4B shows the layer of etching byproduct being removed (or evaporated, or sublimed) from the substrate surface by heating as described above. The operations of etching and removal of etch byproduct(s) need to be repeated a few times until the hard mask is completely removed.

After the hard mask layer 104 is removed, the remaining SOD is removed by a wet etch. In one embodiment, the wet etch chemistry includes diluted HF, such as 100:1 or 60:1 diluted HF. Since SOD/SOG oxide is not as dense as PECVD oxide or thermal oxide, the SOD/SOG dielectric layer can be etched away easily without other PECVD oxide or thermal oxide on the substrate surface being etched (or substantially etched). Table I shows a comparison of etch ratios between different oxide films (using thermal oxide as a reference).

TABLE I

Etch rate comparison of various oxide films

| Type of Oxide | 100:1 diluted HF etch ratio | 60:1 diluted HF etch ratio | NF3 + NH3 plasmarized gaseous etch | HF + NH3 gaseous etch |
|---|---|---|---|---|
| Thermal Oxide | 1 | 1 | 1 | 1 |
| Flowable Oxide | 8 | 7 | 1 | 1 |
| SOD | 9 | 7 | 1 | 1 |
| TEOS-Ozone Oxide (450° C.) | 6 | 5 | 1 | 1 |

In Table I, the flowable oxide is Alectrona and SOD is perhydro-polysilazane (PSZ), offered by TEL (or Tokyo Electron Limited). The etch rate data in Table I show that the dielectric films listed can be etched by etching gas that involved plasmarized $NF_3 + NH_3$ or non-plasmarized $HF + NF_3$ at about the same rate as thermal oxide, which is a dense oxide film. PECVD oxide film is also a dense film, whose etch rate is close thermal oxide. The data in Table I also show that less dense films, such as flowable oxide I, SOD I, and TEOS-Ozone oxide films (deposited at 400° C. and 450°

C.), all have etch rates much higher than the etch rates of thermal oxide when diluted HF solutions (100:1 and 60:1) are used to etch the films. As mentioned above the etch rate of PECVD oxide is close to the etch rate of thermal oxide. Therefore, the less dense oxide films can be removed easily by diluted HF without damaging or etching other dense oxide films, such as thermal and/or PECXD oxide films, on the substrate.

Any dielectric films that have etch rates close to PECVD or thermal oxide when etched with gaseous etchants described above and higher etch rates (or etch selectivities) compared to PECVD oxide or thermal oxide when etched with diluted HF can be candidates for the hard mask removal methods described above. The dielectric film should be hard enough to withstand CMP. A densification process can be used to increase hardness and/or quality of the dielectric film.

Figure 5:
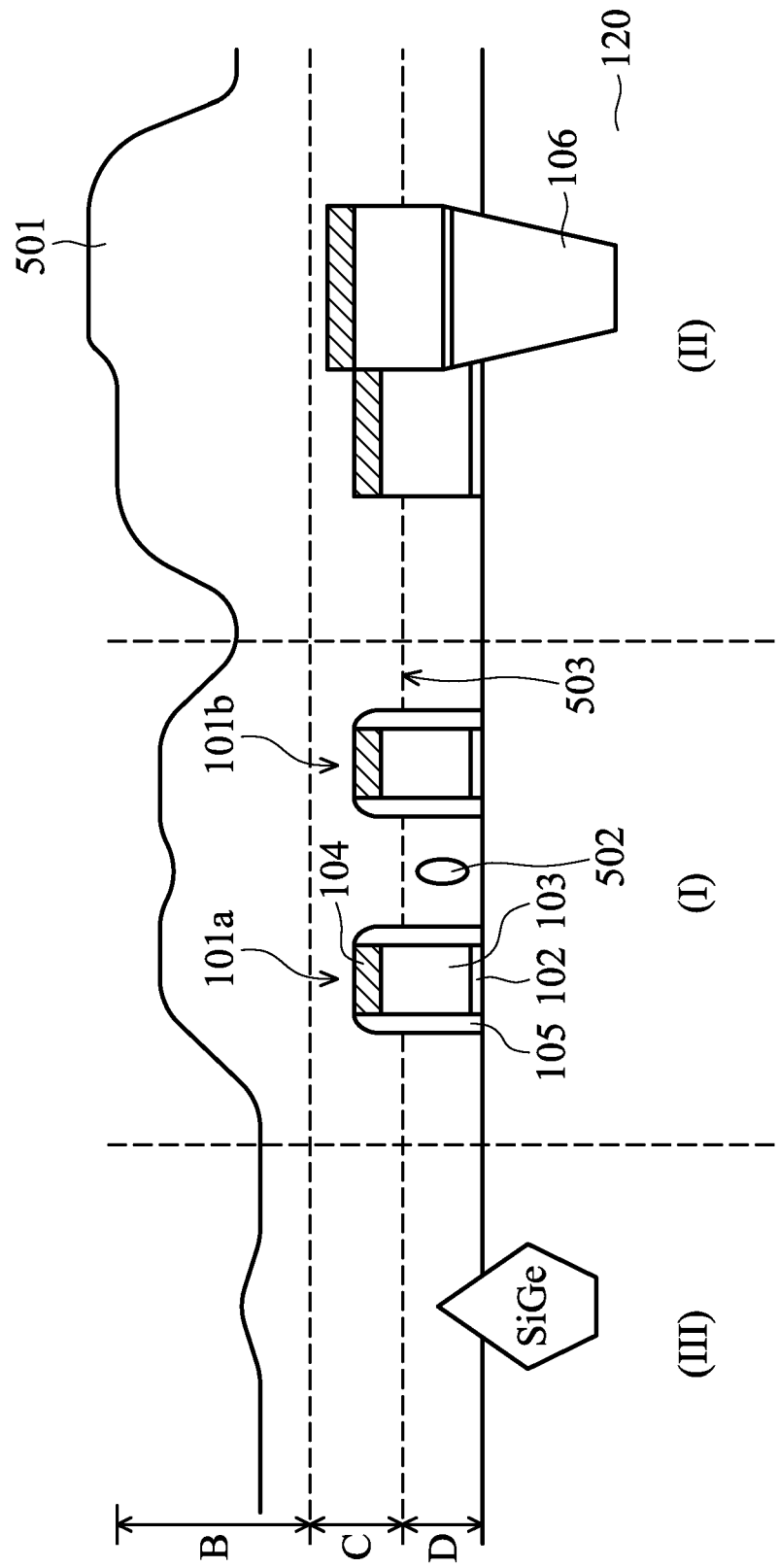
FIG. 5 shows a dielectric film deposited on structures with a hard mask layer, in accordance with one embodiment of this disclosure.

Alternatively, the dielectric films for hard mask removal do not need to have good gap fill. FIG. 5 shows a dielectric film 501 deposited on structures with a hard mask layer, in accordance with one embodiment of this disclosure. The deposited dielectric film does not gap fill space between adjacent gates. Void 502 is shown. However, as long as void 502 is below the gaseous etch (or dry etch) end line 503, the gaseous etching chemistry will not attach the film stacks under the end line 503. During the last operation of removing the remaining dielectric film, the existence of void 501 is not an issue. Spin-on films tend to have good gap fill for small features. Dielectric film deposited by CVD processes, such as by TEOS/Ozone process, that leave voids can still be used for the hard mask removal methods described above.

Figure 6A:
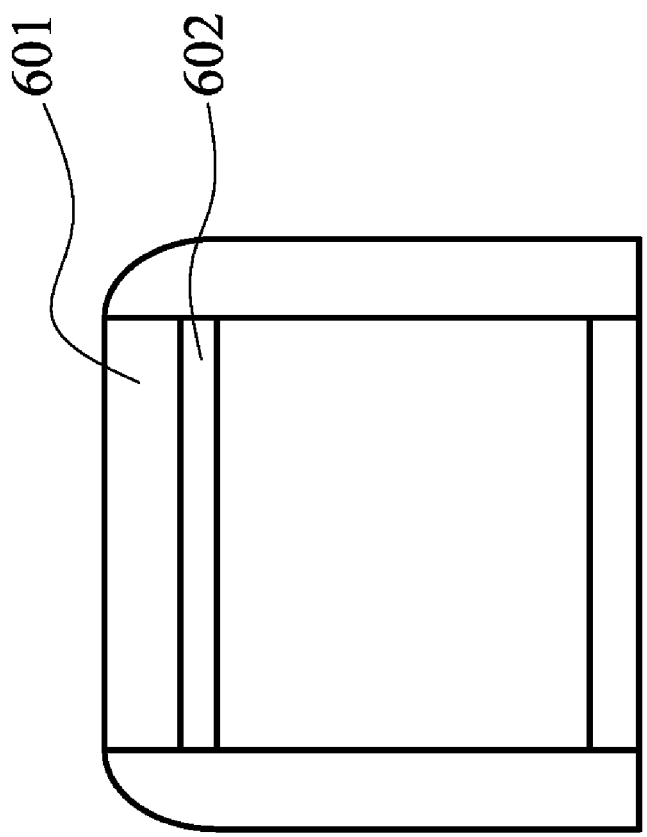
FIG. 6A shows a composite hard mask layer with an oxide layer and a nitride layer, in accordance with one embodiment of this disclosure.

As mentioned above, hard mask layer could be a composite layer. Nitride has substantially lower etch rate than oxide when it is exposed to etchants used to pattern gate stacks that include films, such as a gate dielectric, polysilicon, and maybe other films. However, nitride film has higher film stress than oxide film. Using nitride film as a hard mask could require a thickness that is too high for stress tolerance. As a result, a composite layer that includes an oxide film on top of a very thin nitride can be used for hard mask layer. FIG. 6A shows a composite hard mask layer with an oxide layer 601 and a nitride layer 602, in accordance with one embodiment of this disclosure. For example the thin nitride layer is between about 50 Å to about 200 Å, the oxide layer 352 is between about 50 Å to about 500 Å. The methods described above in FIGS. 3A-5 may also be used to etch a composite hard mask layer. The process is very similar to the process described above, with the exception that an additional nitride layer needs to be etched. The plasmarized $NF_3+NH_3$ gas mixture can also etch nitride film; therefore, the process flow does not change if plasmarized $NF_3+NH_3$ is used. The etch byproduct of nitride film is also $(NH_4)_2SiF_6$ and can be vaporized by heating, as described above.

Figure 6B:
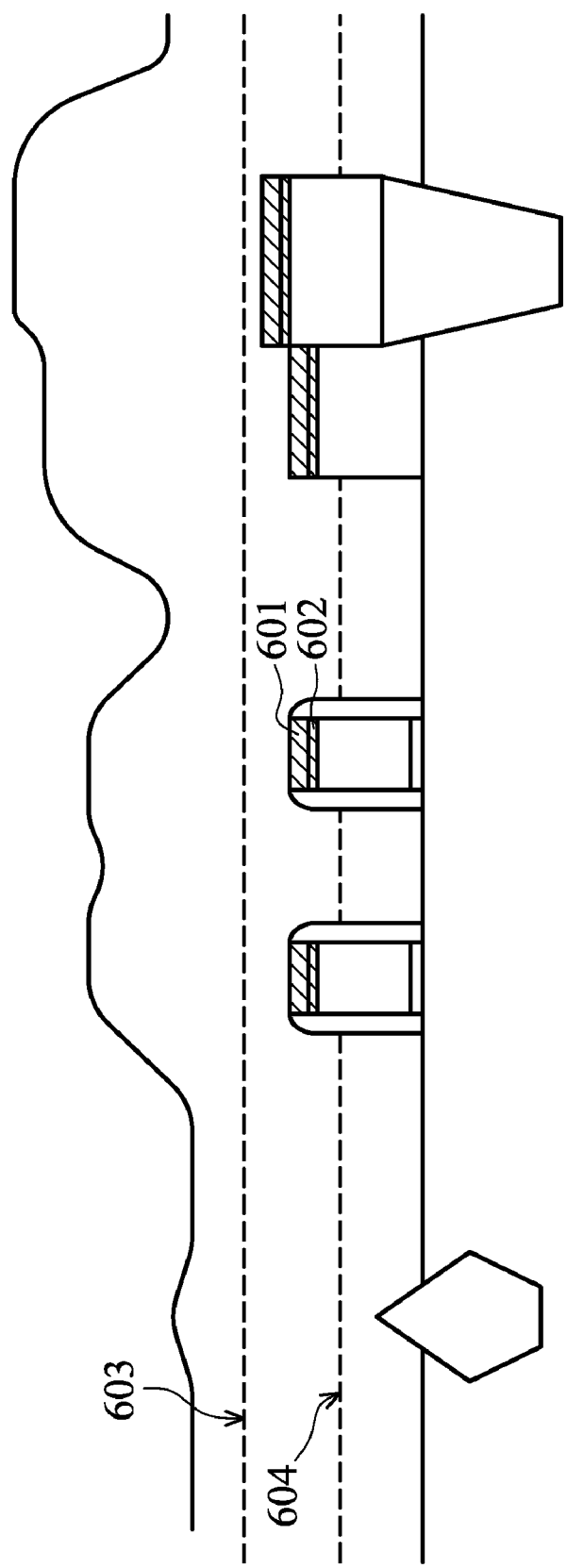
FIG. 6B shows the films related to the gate stacks, the deposited dielectric film, and the end lines of CMP and vapor etch, in accordance with one embodiment of this disclosure.
Figure 6C:
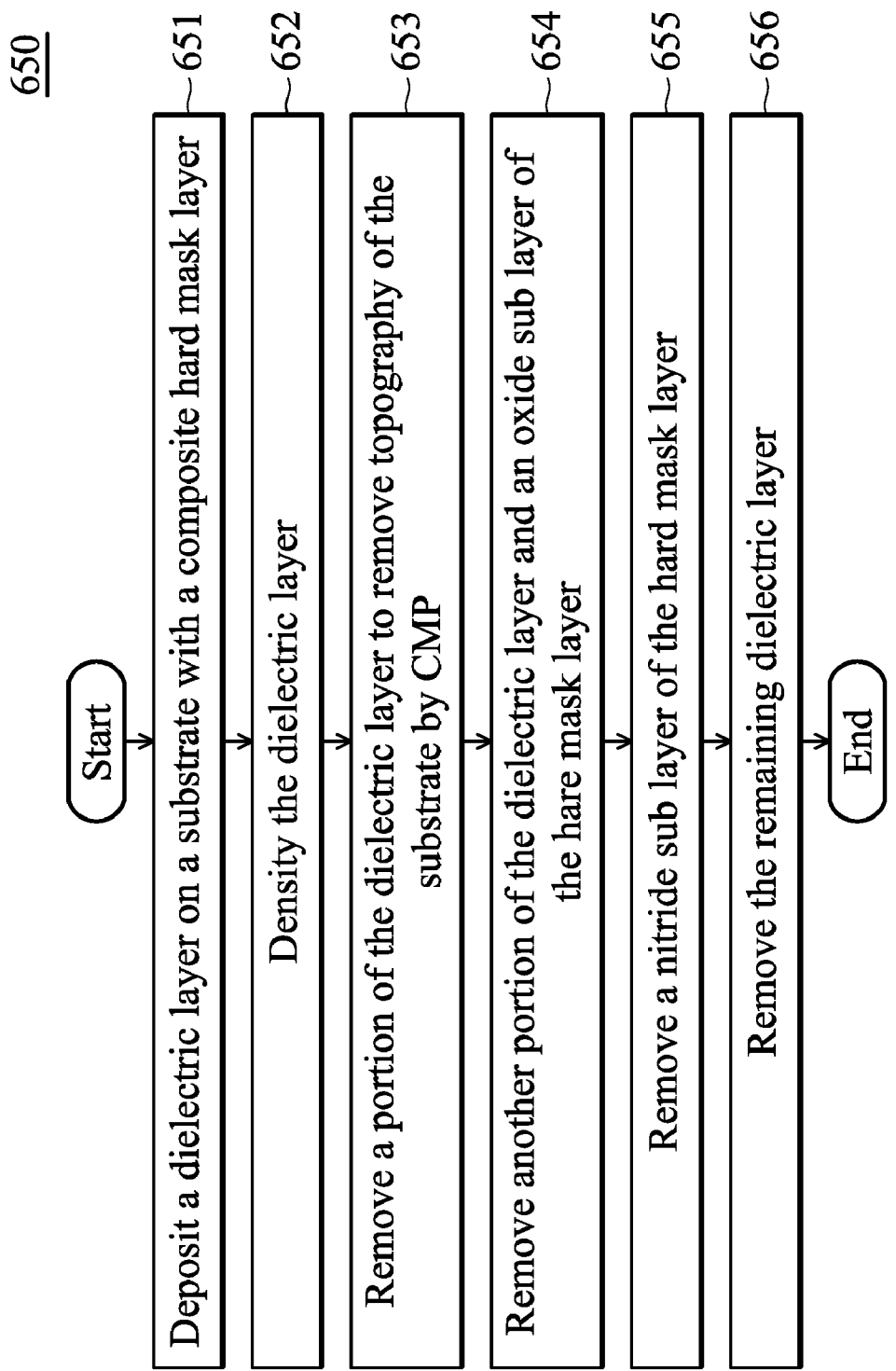
FIG. 6C shows a process flow of removal a composite hard mask layer, in accordance with one embodiment in this disclosure.

However, the $HF+NH_3$ gas does not etch nitride, a nitride etching chemistry needs to be used at the end to remove the thin nitride layer. For example, a short plasma etch with a $C_XF_Y$ gas (a gas containing carbon and fluorine) (dry method) can be used to remove the thin nitride layer. Alternatively, $H_3PO_4$ solution (wet method) can also be used to remove the thin nitride layer. FIG. 6B shows the films related to the gate stacks, the deposited dielectric film, and the end lines of CMP (line 603), vapor etch (line 604), in accordance with one embodiment of this disclosure. FIG. 6C shows a process flow 650 of removal a composite hard mask layer, in accordance with one embodiment in this disclosure. Operations 651, 652, 653 are similar to correlated operations 351, 352, and 353 of FIG. 3B. After the surface topology is removed, the oxide hard mask layer is removed along with part of the dielectric layer in operation 654. As described above, the operations of etching the dielectric film and removal of etch byproduct(s) need to be repeated a few times until the oxide hard mask layer is completely removed.

After the oxide hard mask layer is removed, the nitride hard mask layer is removed at operation 655. In one embodiment, a different etch chemistry from the one used at operation 654 is used. In one embodiment, the different etch chemistry/process etches both the nitride hard mask layer and the dielectric layer. In another embodiment, the different etch chemistry only etches the nitride layer. After the thick oxide hard mask layer is removed, the thin nitride layer is exposed. Therefore, an etch chemistry that only etches the nitride layer can be used. Afterwards, at operation 656, the remaining dielectric layer is removed. In one embodiment, the remaining dielectric layer is removed by a diluted HF solution.

The embodiments of hard mask removal methods described above hard mask over the gate structures to be removed without using a photo mask and photolithography process. The methods are cheaper and easier than conventional methods used to remove hard mask layer over gate stacks. A non-dense dielectric layer (a sacrificial layer) is deposited first and CMP is used to remove surface topography. Thermal densification can be used to increase the hardness of the film to enable CMP. The dielectric layer and the hard mask layer is then etched by fluorine radicals, which form an etch byproduct layer with the dielectric layer and the hard mask layer (also a dielectric film). The byproduct layer is removed by heating. The etching and byproduct removal processes are repeated until the hard mask layer is completely removed. Afterwards, the remaining dielectric layer is removed by a wet etching process, which has high etch rate and selectivity for the dielectric film.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of removing a hard mask used for patterning gate stacks, comprising:
    patterning gate stacks on a substrate, wherein the gate stacks include a polysilicon layer and the hard mask is deposited over the polysilicon layer to assist its patterning;
    depositing a dielectric layer on the substrate after the gate stacks are patterned;
    planarizing a first portion of the dielectric layer by chemical mechanical polish (CMP) to remove topography on the substrate;
    removing a second portion of the dielectric layer and the hard mask by using an etching gas; and
    etching the remaining dielectric layer by using a wet etching chemistry.

2. The method of claim 1, wherein a first etching ratio of the dielectric layer to the hard mask by the etching gas is between about 0.5 to about 2.

3. The method of claim 1, wherein a second etching ratio of the dielectric layer to other films on the substrate by the wet etching chemistry is greater than about 4.

4. The method of claim 1, further comprising:
densifying the dielectric layer after the dielectric layer is deposited and before the first portion of the dielectric layer is planarized to increase hardness of the dielectric film and to enable the dielectric layer to be planarized by CMP.

5. The method of claim 4, wherein the dielectric film is densified by annealing at a temperature less than about 450° C.

6. The method of claim 5, wherein the annealing utilizes rapid thermal annealing or laser annealing for a duration less than 10 minutes.

7. The method of claim 1, wherein the etching gas is activated by a remote plasma.

8. The method of claim 1, wherein the etching gas forms an etch byproduct that deposit on the substrate surface with the dielectric layer, and wherein the etch byproduct deposited on the substrate surface is removed by heating.

9. The method of claim 8, wherein the substrate is repeatedly exposed to the etching gas to form a layer of the etch byproduct and then be heated to evaporate the etch byproduct until the second portion of the dielectric layer is removed.

10. The method of claim 1, wherein the etching gas include a mixture of HF and $NH_3$, or a mixture of plasmarized $NF_3$ and $NH_3$.

11. The method of claim 8, wherein the heating temperature is between about 125° C. to about 180° C.

12. The method of claim 1, wherein the wet etching chemistry is a diluted HF solution.

13. The method of claim 1, wherein the hard mask is made of an oxide layer or an oxide layer over a nitride layer.

14. The method of claim 1, wherein the dielectric layer is a spin-on-glass, a spin-on-dielectric, a TEOS/Ozone oxide, or a flowable CVD oxide film.

15. A method of removing a hard mask used for patterning gate stacks, comprising:
patterning gate stacks on a substrate, wherein the gate stacks include a polysilicon layer and the hard mask is deposited over the polysilicon layer to assist its patterning;
depositing a dielectric layer on the substrate after the gate stacks are patterned;
planarizing a first portion of the dielectric layer by chemical mechanical polish (CMP) to remove topography on the substrate, wherein a first etching ratio of the dielectric layer to the hard mask by the etching gas is between about 0.5 to about 2;
removing a second portion of the dielectric layer and the hard mask by using an etching gas; and
etching the remaining dielectric layer by using a wet etching chemistry, wherein a second etching ratio of the dielectric layer to other films on the substrate by the wet etching chemistry is greater than about 4.

16. The method of claim 15, further comprising:
densifying the dielectric layer after the dielectric layer is deposited and before the first portion of the dielectric layer is planarized to increase hardness of the dielectric film and to enable the dielectric layer to be planarized by CMP, wherein the dielectric film is densified by annealing at a temperature less than about 450° C.

17. The method of claim 15, wherein the etching gas forms an etch byproduct that deposit on the substrate surface with the dielectric layer, and wherein the etch byproduct deposited on the substrate surface is sublimed by heating, and wherein the substrate is repeatedly exposed to the etching gas to form a layer of the etch byproduct and then be heated to sublime the etch byproduct until the second portion of the dielectric layer is removed.

18. The method of claim 15, wherein the dielectric layer is a spin-on-glass, a spin-on-dielectric, a TEOS/Ozone oxide, or a flowable CVD oxide film.

19. The method of claim 15, wherein the etching gas include a mixture of HF and $NH_3$, or a mixture of plasmarized $NF_3$ and $NH_3$.

20. A method of removing a dual-layer hard mask used for patterning gate stacks, comprising:
patterning gate stacks on a substrate, wherein the gate stacks include a polysilicon layer and the dual-layer hard mask is deposited over the polysilicon layer to assist its patterning, wherein the dual-layer hard mask includes an oxide layer over a nitride layer;
depositing a dielectric layer on the substrate after the gate stacks are patterned;
planarizing a first portion of the dielectric layer by chemical mechanical polish (CMP) to remove topography on the substrate, wherein a first etching ratio of the dielectric layer to the dual-layer hard mask by the etching gas is between about 0.5 to about 2;
removing a second portion of the dielectric layer and the dual-layer hard mask by a first etching gas and a second etching gas, wherein the first etching gas removes the second portion of the dielectric layer and the oxide layer of the dual-layer hard mask, and wherein the second etching gas removes the nitride layer of the dual-layer hard mask; and
etching the remaining dielectric layer by using a wet etching chemistry, wherein a second etching ratio of the dielectric layer to other films on the substrate by the wet etching chemistry is greater than about 4.

* * * * *